United States Patent [19]

Endo et al.

[11] Patent Number: 4,866,405
[45] Date of Patent: Sep. 12, 1989

[54] AMPLITUDE MODULATION APPARATUS

[75] Inventors: Katsuhiro Endo; Yasumichi Imai, both of Sagamihara, Japan

[73] Assignee: U.S. Philips Corporation, New York, N.Y.

[21] Appl. No.: 169,676

[22] Filed: Mar. 18, 1988

[30] Foreign Application Priority Data

Mar. 20, 1987 [JP] Japan .................. 62-63698

[51] Int. Cl.⁴ .................. H03C 1/00; H03C 1/06
[52] U.S. Cl. .................. 332/159
[58] Field of Search .................. 332/31 R, 37 D, 38, 332/44, 45; 455/108, 109, 126, 63, 116, 118; 375/58, 60

[56] References Cited

U.S. PATENT DOCUMENTS 4,088,956  5/1978  Axman .................. 455/108
4,539,707  9/1985  Jacobs et al. .................. 455/109

Primary Examiner—David Mis
Attorney, Agent, or Firm—Marianne R. Rich; Algy Tamoshunas

[57] ABSTRACT

An amplitude modulation apparatus characterized in that a high frequency modulation circuit is provided at the down-stream side of an automatic output control circuit which inputs a low frequency signal, the high frequency signal level of an output of said high frequency modulation circuit being detected to obtain a detection signal which activates said automatic output control circuit.

3 Claims, 1 Drawing Sheet

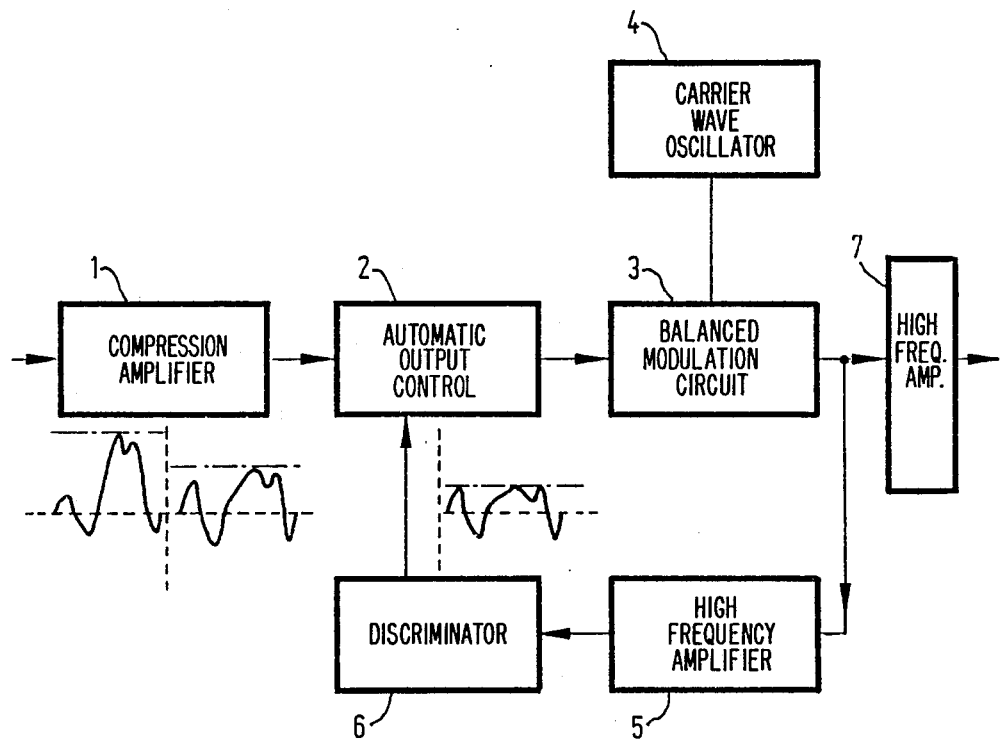

AMPLITUDE MODULATION APPARATUS

DETAILED DESCRIPTION OF THE INVENTION

(Industrial Applicability)

This invention relates to wireless apparatuses of the amplitude modulation type and more particularly to such an amplitude modulation apparatus in which a low-frequency amplification circuit is controlled in accordance with a feedback from the high-frequency stage.

This invention is suitable for use in the amplitude modulation of an SSB transceiver, wherein a good linearity and a low distortion are required, and is utilized in such an apparatus in which a good linearity and a low distortion are required in the processing of a low frequency signal of a large dynamic range.

(Prior Art)

Conventionally, when a low frequency signal, such as an audio frequency (AF) signal, is modulated on a high frequency signal and is high-frequency-amplified, the over-level during the amplification is controlled by means of an auto-level control (ALC) or an auto-gain control (AGC). However, such conventional technique has been disadvantageous in that a signal clipping is liable to occur, in that the signal is liable to be subject to a distortion, and in that if a distortion is introduced in the low-frequency signal stage the distortion can not be corrected. In the case where the dynamic range is restricted by means of a low-frequency limiter, the distortion generated therein can not easily be removed by a filter or the like. The clipped audio signal yields an indistinct sound when reproduced, and when the transient high-frequency is remaining due to an insufficient control of the over-level, unnecessary power is radiated, during reproduction, due to a high-frequency noisy sound.

It has been pointed out by the analysis of the conventional technique that a microphone amplifier (Audio Frequency stage) without an auto-level control (ALC) is liable to generate a distortion at its output and that a distortion due to ALC is liable to be produced at the high-frequency (Radio Frequency) stage so that the sound or voice is distorted when the ALC operates.

In another conventional method, large dynamic-range portions of the low-frequency signal are detected to cause ALC to operate with respect to the amplification of the low-frequency signal. This method is however disadvantageous in that the response to an attack of a transient waveform signal is slow so that the distortion becomes large. Since such an attack time and a release time are often long, such a time of an audio signal can be varied as a result. The dynamic level of a human voice is about 40 dB, and therefore a clipping and hence a distortion can not be prevented from occurring if the dynamic range of an amplifier with ALC used for raising the average power of the low-frequency signal (AF) is smaller than the voice dynamic level. A clipped signal, if contained, makes the reproduced voice or sound indistinct, and thus prevents the intelligibility from becoming high in an SSB wireless apparatus. Specifically, in an ALC circuit for an audio-frequency-stage amplifier, one of the causes of the distortion is the delay time due to a capacitance of the uF order, which delay is introduced when a feedback signal for the ALC is formed by detecting or discriminating the amplifier output.

(Measures to Solve the Problems)

According to the present invention, in order to remove the distortion caused by the delay of the autolevel control (ALC) for the low-frequency amplifier, the output of the low-frequency amplifier is modulated on a high-frequency signal, and the gain of the low-frequency amplifier is controlled in accordance with the detected or discriminated signal of this at high-frequency stage. In order for further reducing the distortion, the low-frequency signal is passed through an amplifier of the compression type, and is then inputted to a low-frequency amplifier which is controlled by the detection signal at the high-frequency stage.

BRIEF DESCRIPTION OF THE DRAWINGS

The FIGURE is a block diagram of an embodiment of the present invention
1. amplifier of the compression type;
2. automatic output control circuit;
3. balanced modulation circuit;
4. carrier wae oscillator;
5. high-frequency amplifier;
and 6. detector.

(Operation and Embodiment)

Since an high-frequency (RF) signal can be detected or discriminated with a capacitance of the pF order, a locally large amplitude portion of the low-frequency signal can be derived, through detection, from the modulated high-frequency signal during the time of the order of 1/1000 second when such a portion normally continues. The detected signal is then fed back to an automatic output-control circuit for the low-frequency signal to thereby control the amplitude of the low-frequency signal so that the locally large amplitude portion is restricted to a desired dB. Since the capacitance for the signal detection can be changed from the order of uF, which is for the low-frequency signal, to the order of pF, the delay of the feedback signal can be restricted to such an extent which is not audibly detectable, whereby abnormal amplitudes can be efficiently suppressed. It will be a measure of such effectiveness and use that the duration of a strong sound or voice of a large amplitude is of the order of 1/10 second for the averge frequency of 10 KHz of an audio sound.

Moreover, since it is difficult to raise the average power of an audio input signal of 100 dB (normally several tens dB) and it is therefore difficult to enhance the intelligibility of an SSB transceiver, the above-mentioned automatic output control circuit may be operated such that the dynamic range of the audio input signal is compressed to about a half. In order to reduce, with certainly, the distortion of the low-frequency (AF) signal which includes various strong sound or voices and locally large amplitudes, the dynamic range of the low-frequency signal is compressed by an amplifier of the compression type to, for example, a half, and is further compressed by the above-mentioned automatic output control circuit to its half. As a result, the low-frequency (AF) signal before the high-frequency stage are substantially free from distortion, so that the signal will not be distorted even if a strong voice is inputted, and an automatic gain control in the high-frequency amplifier at the high-frequency (RF) stage is not necessary. The reduction of distortion in the present invention is remarkable when compared with the fact that it has been impossible for the conventional auto-gain control (AGC) or the auto-level output (ALC), effected during the amplification of the high-frequency signal, to correct the distortion introduced at the low-frequency stage.

In an embodiment for an audio signal shown in the FIGURE, the dynamic range of an audio low-frequency (AF) signal is compresed to a half by an amplifier 1 of the compression type in which small amplitudes of the signal are enlarged, whereby the average power of the signal is raised. The amplified signal is then passed through an automatic output control circuit 2 and is mixed with an output of a carrier wave oscillator 4 at a balanced modulation circuit 3 to produce a high-frequency signal. This high-frequency signal is a carrier-wave-suppressed double side band signal (DSB wave), so that the output of this signal varies linearly with the magnitude of the audio input signal.

A fraction of this output is amplified by a high-frequency amplifier 5 and is then detected or discriminated by detector 6 to form a DC voltage signal corresponding to the input. The gain of the automatic output control circuit 2 is lowered when the DC voltage signal becomes high so that the high-frequency output does not exceed a certain level.

Alternatively, the quickly responsive detection voltage is fed back to the automatic output control circuit 2 such that the dynamic range of the input low-frequency signal is compressed. When the dynamic range of the outpt of the low-frequency signal is compressed to about 5 to 6 dB and also when the average power thereof is raised, the high-frequency (RF) amplifier 7 can effect a linear amplification within an ideal linear amplification range of 5 to 6 dB which the amplifier 7 normally possesses. This means that, at the stage of high-frequency amplification, the high-frequency signal is substantially free from a distortion. As described earlier, the signal upstream of the balanced modulation circuit 3 is also substantially free from a distortion and its average power has been raised. As a result, both of the low-frequency and high-frequency signals are free from a distortion, and a sound or a voice reproduced from the high-frequency signal of the high average power can have a good intelligibility.

(Advantageous Effects of the Invention)

The amplitude modulation apparatus according to the present invention is advantageous in that the signal is substantially free from a distortion up to the high-frequency modulation or the balanced modulation and in that even a large audio input is free from a distortion. It is therefore not necessary to provide an automatic gain control on the side of the high-frequency (RF) amplification, and a low distortion within the specified output power can be realized. It is also possible to make the distortion, at a strong voice input, one tenth the value in the conventional apparatus.

According to the present invention, since the amplitude at the high-frequency (RF) stage is controlled by means of the amplitude adjustment at the low-frequency (AF) stage, these adjustment and control are simple and certain. This fact is particularly compared to the fact that it is very difficult to detect the distortion produced at the low-frequency (AF) amplifier if the control is effected at the high-frequency stage in accordance with the detection of amplitude of the high-frequency signal.

According to the present invention, the overshoot during the high-frequency amplification can be avoided by the amplitude adjustment at the low-frequency stage, so that the function of the automatic output control can be realized by a single gain control volume which is responsive to the detection signal of the high-frequency signal. Also, it is not necessary to provide a circuit loop for the automatic output control in the high-gain high-frequency (RF) circuitry, so that the stability of the transmitting apparatus itself, in the case of a SSB transceiver, can be enhanced.

By virtue of the above-described advantageous effects, the size and the costs of the apparatus can be reducedl. As to the waveform characteritic, by virtue of the use of the RF detection, the attack time and the release time become short, and therefore the waveform distortion due to the delay in the feedback is small.

We claim:

1. An amplitude modulation apparaus for receiving a low frequency signal and for producing a modulated high frequency signal, comprising:
   automatic output control means for receiving an input signal corresponding to the low frequency signal and for producing a controlled low frequency signal;
   means for producing a high frequency signal;
   modulator means for modulating the high frequency signal with the controlled low frequency signal to produce the modulated high frequency signal;
   discriminator means for receiving and demodulating at least a portion of the modulated high frequency signal and for producing a feedback signal that corresponds substantially only to the modulation of the modulated high frequency signal and, thus, also corresponds substantially only to the low frequency signal;
   said automatic control means further comprising means for receiving the feedback signal and means for controlling the amplitude of the controlled low frequency signal in response to the feedback signal.

2. The amplitude modulation apparatus of claim 1 wherein said discriminator means includes capacitance means having a capacity on the order of picofarads.

3. The amplitude modulation apparatus of claim 1 further comprising a compression amplifier for receiving the low frequency signal and producing a compressed low frequency signal that has a reduced dynamic range as compared to the low frequency signal, said compressed low frequency signal being the input to the automatic output control means.

* * * * *